United States Patent [19]
Müller et al.

[11] Patent Number: 5,366,569
[45] Date of Patent: Nov. 22, 1994

[54] METHOD FOR PRODUCING A CORROSION-RESISTANT COMPOSITE WIRE

[75] Inventors: Volker Müller; Manfred Fehn; Hans Sommer, all of Saalfeld; Hans-Jürgen Grunwald; Ulf Höltge, both of Magdeburg, all of Germany

[73] Assignee: SKET Schwermaschinenbau Magdeburg GmbH, Magdeburg, Germany

[21] Appl. No.: 40,011

[22] Filed: Mar. 30, 1993

[30] Foreign Application Priority Data

Mar. 31, 1992 [DE] Germany ............... 4211167

[51] Int. Cl.$^5$ .............. C22F 3/00; C21D 9/52; H05B 7/18
[52] U.S. Cl. ............... 148/525; 148/529; 148/532; 148/534; 228/130
[58] Field of Search ............ 148/520, 521, 524, 525, 148/529, 532, 534; 72/47; 228/129, 130

[56] References Cited
U.S. PATENT DOCUMENTS

| | | | |
|---|---|---|---|
| Re. 28,526 | 8/1975 | Ziemek | 228/130 |
| 1,963,745 | 6/1934 | Ingersoll et al. | 228/129 |
| 3,854,193 | 12/1974 | Yamaguchi et al. | 72/47 |
| 3,894,675 | 7/1975 | Klebl et al. | 228/130 |
| 4,134,528 | 1/1979 | Bähre et al. | 228/130 |
| 4,156,500 | 5/1979 | Yoshida et al. | 228/130 |
| 4,819,858 | 4/1989 | Malone et al. | 228/130 |

FOREIGN PATENT DOCUMENTS

| | | | |
|---|---|---|---|
| 2153317 | 5/1973 | Germany | 228/130 |
| 2727186 | 1/1979 | Germany | 228/129 |
| 255361 | 3/1988 | Germany | 148/532 |
| 258249 | 7/1988 | Germany | 148/532 |
| 57-123928 | 8/1982 | Japan | 148/532 |
| 58-179583 | 10/1983 | Japan | 148/521 |
| 59-215422 | 12/1984 | Japan | 148/532 |
| 1280909 | 7/1972 | United Kingdom | 72/47 |
| 2085330A | 4/1982 | United Kingdom | 72/47 |

*Primary Examiner*—John Zimmerman
*Attorney, Agent, or Firm*—Weingarten, Schurgin, Gagnebin & Hayes

[57] ABSTRACT

The object of the invention is a corrosion-resistant composite wire with diameters <10 mm, which has a concentric, homogeneous high-grade steel coating, wherein this coating, depending on the diameter of the wire and the application, can vary 15–30% by volume, and its strength can vary, depending on the core wire used and the degree of forming, up to ≦2000 N/mm$^2$. To produce such a composite wire, for example, a high-strength, patented and surface-pretreated steel wire is sheathed with a strip of high-grade steel. In the first forming step, the longitudinally welded high-grade steel sheath is pressed tightly onto the core wire and in subsequent drawing steps, the composite wire is drawn to the final dimensions. At least between two forming steps, there is a selective annealing treatment of the composite wire by means of a rotary arc, whereby only the high-grade steel layer is heated to the annealing temperature.

10 Claims, 4 Drawing Sheets

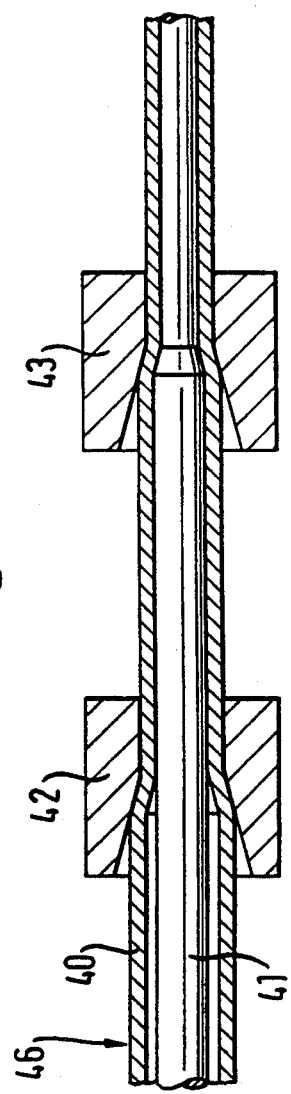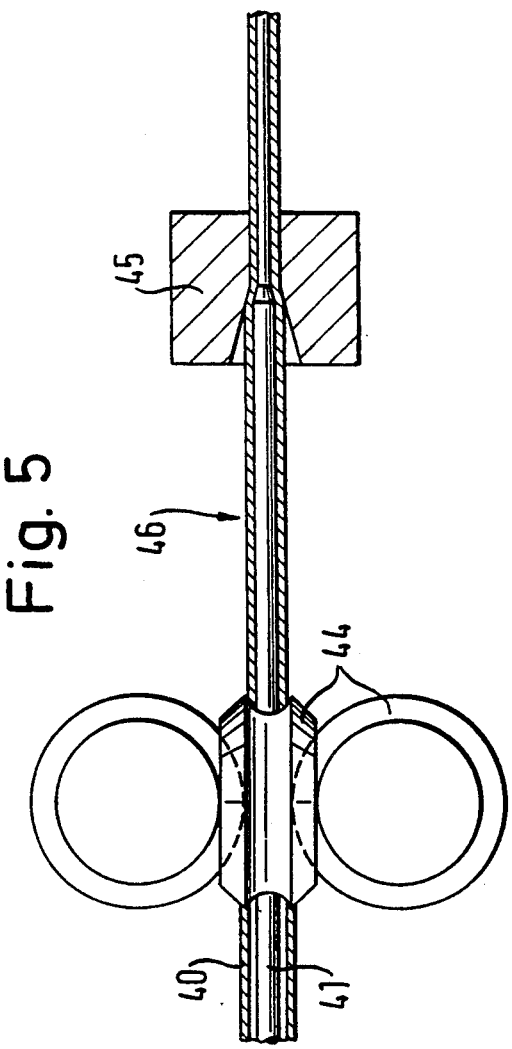

METHOD FOR PRODUCING A CORROSION-RESISTANT COMPOSITE WIRE

FIELD OF THE INVENTION

This invention relates to a method for production of composite wire, and more particularly to a method for production of corrosion-resistant composite wire.

BACKGROUND OF THE INVENTION

In many technical fields, especially civil engineering and the wire and cable industry, the requirements for fatigue strength and corrosion resistance made on the materials used are increasing. For example, in engineering, to respond to the effects of "concrete cancer," engineers are looking for ways of replacing the technically adequate, but expensive stainless steels with cheaper materials. Galvanized, plastic coated or painted steel wire and cable do not sufficiently meet this requirement, because they are subject to certain usage-related limitations, like for example, temperature, welding problems and an easily damaged or brittle exterior. Solid high-grade steel wires are too expensive or do not meet the requirements for strength and aging stability.

In a known plant that produces profile steel and steel rods with non-rusting outer coatings, bimetal billets, in which the two materials are combined metallurgically, are hot-rolled into angle steel, flat steel, square and hexagonal steel, as well as round steel in the 10–50 mm diameter range. The disadvantages of the rod material produced according to this process are its limited strength, under 660 N/mm$^2$, the diameter range of the round steel produced, which is limited to more than 10 mm, the perfectly concentric high-grade steel coating which cannot be achieved by the rolling process and the narrow possibility of varying the thickness of the high-grade steel coating by only 20–25% by volume. Nor can this round steel be further processed into high-grade wire for wire cable.

SUMMARY OF THE INVENTION

The present invention provides a method for producing a corrosion-resistant composite wire with diameters under 10 mm, which can be used universally and also has high fatigue strength and high corrosion resistance in critical environments with changing demands.

A composite wire produced by the present method comprises a wire having a core of high-strength steel wire and a high-grade steel coating, whose volume proportion in relation to the composite wire is 15 to 35 percent by volume, wherein the composite wire has a diameter $<10$ mm, and a strength $\leq 2000$ N/mm$^2$.

Compared to the known corrosion-resistant composite billet, the composite wire in the invention has the advantages of universal applicability, for example, as a starting material for high-grade cables, as a reinforcing element in engineering and in all technical fields in which, until now, only copper or high-grade (solid) steel could be used for the outer layer.

Because of the tight connection between the outer layer and the core wire, tensile strengths are achieved that could not be attained with comparable known billet material (steel-copper). Since the core wire forming the main component consists of an inexpensive material, there is also a serious cost advantage over solid high-grade steel wire.

The present invention also relates to a non-scaling copper wire which has good electrical conductivity and excellent resistance to corrosive influences resulting from high temperatures.

Such a non-scaling copper wire has a core wire made of copper and a continuous high-grade steel coating.

The advantages of this composite wire are in its excellent electrical conductivity, high surface strength and temperature and corrosion resistance. This composite wire can be used, inter alia, as a new type of electrical lead for heating elements.

An especially suitable process for producing such corrosion-resistant composite wire is specified in which a surface-treated core wire is sheathed in a metal strip which is welded longitudinally. After the cross-section of the composite wire has been reduced by approximately 65%, the composite wire is annealed such that only the outer metal layer reaches the annealing temperature. The process in the invention makes it possible inexpensively to produce various types of composite wire in continuous sequence. By the concerted heat yield, which can be controlled, in the outer metal layer, the hardening of the outer coating that occurs in the drawing steps during forming is effectively counteracted, without negatively influencing the texture of the core material. Moreover, repeated drawing and annealing operations produce a high-strength connection between the pre-activated surface of the core material and the interior of the metal cover, which contributes substantially to the high overall strength and corrosion resistance of the new composite wire.

According to the process in the invention, composite wire can be produced from high-grade steel sheathing and a steel core or high-grade steel sheathing and a copper core, as well as from other combinations of metals whose properties and textures have been synchronized, and already existing drawing plants can be converted to produce the composite wire in the invention at relatively low expense.

DESCRIPTION OF THE DRAWINGS

Other advantages and special features of the invention can be inferred from the following description of a plant for carrying out the production process, which is represented schematically as an example of the embodiment on the attached drawings, which show.

DETAILED DESCRIPTION

Figure 1:
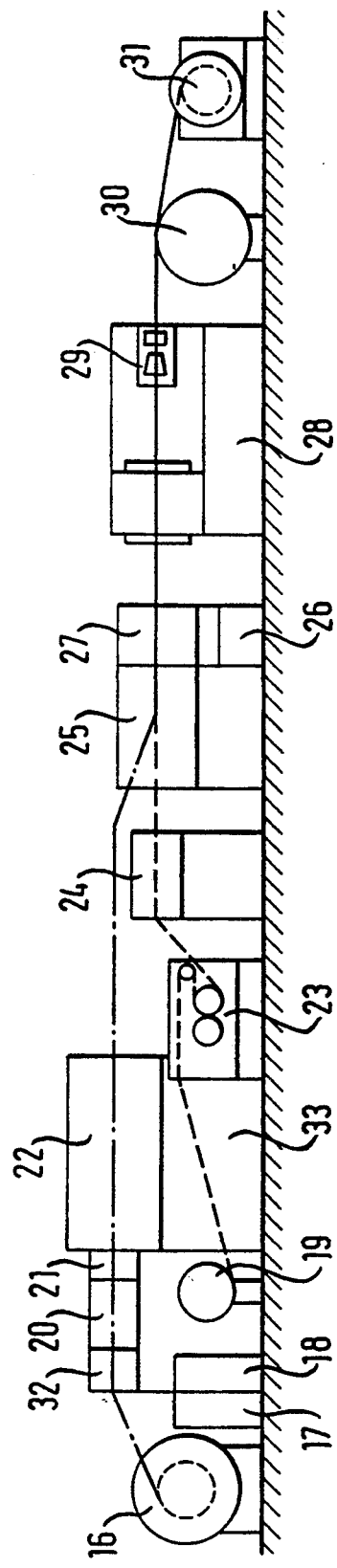
FIG. 1 the finishing plant for encasing the core wire

In the finishing plant shown in FIG. 1, a surface-treated, for example brushed, core wire of high-strength steel, free of deposits, is continuously sheathed at an encasing station with a strip of high-grade steel formed into a pipe and welded longitudinally.

Figure 2:
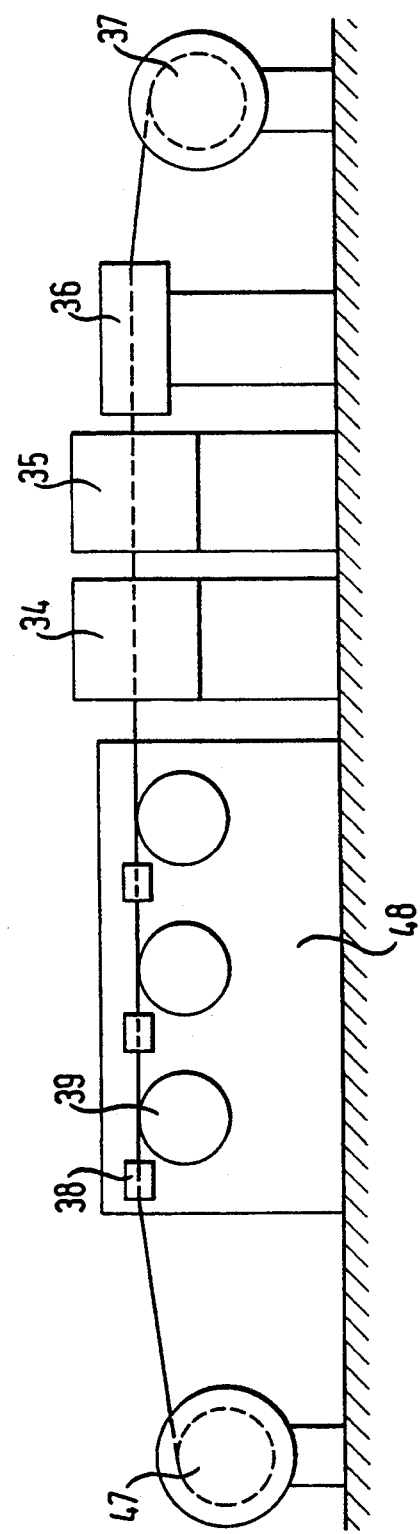
FIG. 2 the drawing-annealing plant for producing the composite wire in the invention FIG. 3 an arc device used in the finishing plant in FIG. 2 as an annealing station FIG. 4 a preferred form of embodiment of a feed/tension device FIG. 5 another form of embodiment of a feed/tension device.

According to FIG. 2, in the subsequent drawing and annealing stages, the sheathed pipe is connected permanently to the core wire so it interlocks. Thorough cleaning and pretreatment of the surfaces to be connected to one another is an essential requirement to obtain a sufficiently strong composite effect that is free of flaws.

A drum wound with polished round core wire is used in a take-off device 16. The beginning of the wire of the respective drum is connected to the end of the length of wire using a wire butt-welding machine 17. After the weld is made, the encasing machinery can be put in operation. After passing through a wire adjustment device 32, the wire runs through an ultrasound cleaning station 20 in order to eliminate any drawing material or other foreign elements that may still adhere to the surface of the wire.

The cleaning agents in the ultrasound cleaning station 20 are water-soluble, biologically and chemically degradable media. Alternately or additionally, an arc device, as in FIG. 3, can be used to remove surface coatings adhering to it. The clean, dry steel wire runs through another wire adjustment device 21 and a brushing device 22 amid inert gas into an encasing station or pipe profile 25. The wire is turned on the axis of the pipe profile 25 before or after the wire brushing device 22 or the arc device.

The strip of high-grade steel shown in FIG. 1 is taken up on a dual-swiveling reel, not shown in detail, by means of a suitable means of transport. Connecting the strip lengths of several small bundles in a strip-diagonal-weld device 18 and winding them on a dual-swiveling reel 19 creates large bundles of high-grade steel, whose strip length roughly corresponds to the lengths of wire on the steel wire reel of the take-off device 16.

After passing a strip looping roller, which serves as the drive control on the take-off side of the double-storage reel 19, the strip of high-grade steel goes through a strip cleaner 33, in which any elements still sticking to the surface are removed. Here again, the principle of ultrasound cleaning with water-soluble, biologically and chemically degradable media is used. In a subsequent strip-trimmer 23, the clean strip of high-grade steel is cut to the bandwidth corresponding to the pipe diameter to be formed. For further optimum preparation of the surface of the strip of high-grade steel, as with the steel wire, especially the strip surface facing the steel wire is treated in a brushing station 24 by means of round rotary brushes in order to produce highly active surfaces free of adhesive coatings. After brushing, the strip of high-grade steel, like the treated steel, runs through inert gas until it is formed together.

The high-grade steel strip is formed in the pipe profile 25 continuously around the core wire into a pipe with a longitudinal slit on top and a steel wire inside. In a pipe welding device 27 arranged right after it, the longitudinal slit is welded directly in continuous sequence according to the TIG welding process with no additional materials by means of multi-electrode burners. Other high-speed welding processes, like electron beam or laser welding, can also be used.

The profiling and pipe-welding take place in a closed hood in the presence of inert gas. A welding spot lens is used to set the burner and observe the welding process.

Next, the high-grade steel pipe 40 with the core wire 41 inside, according to FIG. 4 or 5, goes into a feed/tension device 28.

According to the form of embodiment in FIG. 5, this consists of a roller device arranged on the inlet side in the form of a four-roller pass 44, which rolls the high-grade steel sheath 40 tightly on the core wire 41—pressing the high-grade steel sheath 40 onto the core wire 41 in this place is not allowed, since there are still relative velocities between the core wire 41 and the high-grade steel sheath 40—and on the outlet side of a drawing device 29. After the coating 46 of the surface of the high-grade steel sheath 40 with a drawing-medium carrier (borax-based aqueous solution), a deformation of 8–15% is achieved by means of the drawing die 45 arranged in the drawing device 29. The high-grade steel sheath 40 and the core wire 41 are formed together.

Here it is essential that the high-grade steel sheath 40 be cooled before it runs into the four-roller pass 44. Otherwise, there would be a danger of the bearings of the four-roller pass 44 heating up as a result of the heat from the pipe-welding process. After it goes through the four-roller pass 44, it is helpful to heat the high-grade steel sheath 40 to dry the drawing-medium carrier that was applied.

FIG. 4 shows the preferred form of embodiment of a feed/tension device 28. Instead of the above-mentioned roller device, a drawing device with a drawing die 42 can be used. This drawing die 42 also causes the high-grade steel sheath 40 to be applied tightly to the core wire 41.

The coating 46 of the high-grade steel sheath 40 with the drawing-medium carrier takes place directly behind the pipe-welding device 27, so that the drawing-medium carrier is guaranteed to dry as a result of the heat caused by the welding process.

Another drawing die 43, which carries out the desired forming of 8%–15% is then arranged after the drawing die 42. After this feed/tension according to FIG. 4 or 5, a more secure form fit (press fit) between the core wire 41 and the high-grade steel sheath (40) is guaranteed.

A pull-off capstan 30 transports the materials through the equipment in the plant. With a winder 31, the semifinished high-grade steel wire is wound on drums and is available in this form as starting material for further processing in subsequent drawing and annealing steps to bind the core wire and the sheath.

The encasing plant is operated centrally from a main control panel 26, which is arranged right next to the pipe-welding equipment 27, in order to make it easier for the plant operator to observe the welding process.

To achieve a bond between the core wire and the sheath made of high-grade steel, the drawing and annealing steps already described must not be neglected.

FIG. 2 shows the preferred embodiment for the first drawing-annealing process of a drawing-annealing plant. The semifinished high-grade steel wire on the drums is used on a take-off device 47. The drawing machine 48 after the take-off device 47 is in charge of further forming of the wire. The drawing die boxes 38 arranged in front of the drawing dies 39 have two drawing dies each mounted on them, a preliminary die for feeding the wire precisely in the middle of the forming drawing dies and the drawing die that actually does the forming. The drawing dies 39 each have an individual drive. The controls between the drawing dies ensure that the process is careful and slip-free. After 65% forming, the further capacity of the high-grade steel sheath to be formed is exhausted; the core wire can be formed further. The wire then goes through an ultrasound cleaning machine 34 to remove any drawing materials adhering to it. The cleaning principle is identical to the one in the encasing machine. After it, the wire is fed into an arc machine 35 according to FIG. 3. To obtain high-grade steel sheathing that can be formed further, only the sheathing is annealed and cooled for a short period using the arc machine 35, i.e., the composite wire is annealed only on its surface, the core wire only reaches temperatures < 400° C. (no annealing) and thus maintains its inherent strength and additional strength due to the forming (drawing steps).

After the drawing/annealing process, there is sufficient adhesion strength between the core wire and the high-grade steel sheath (comparable to a cold-press welding cycle). After that, the composite wire goes through another cooling device 36, which can also be used as a drawing medium carrier coating, if other drawing forming follows. With a winder 37, the composite wire is wound again on spools and is available in this form as a finished material or a starting material for other drawing forming. After total reductions in cross section of $\geq 85\%$, strengths up to 2000 N/mm$^2$ can be reached.

Figure 3:
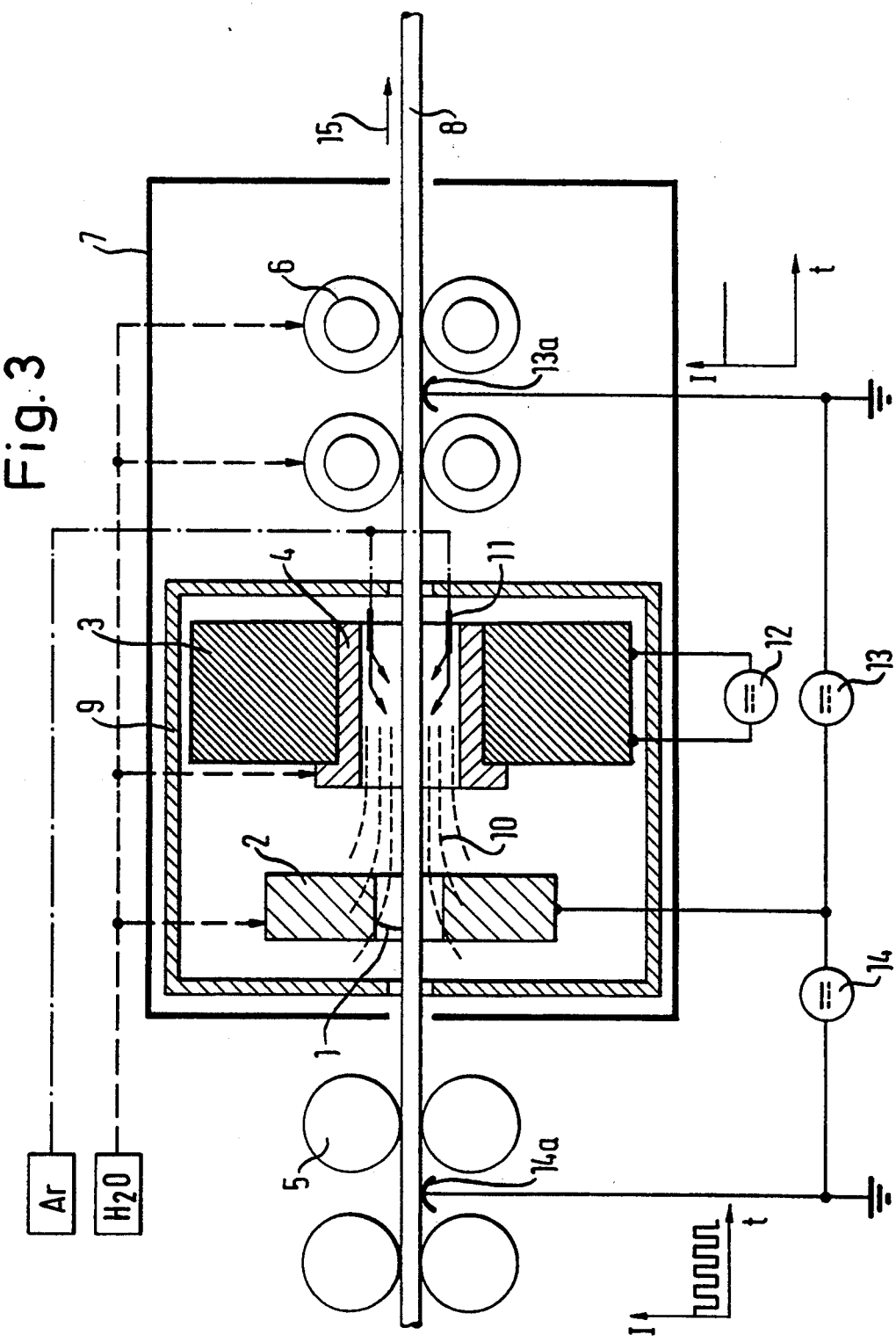

The arcing device shown in FIG. 3 contains a box 7 with an annular electrode 2 arranged on the outlet side to produce an arc 1 between its interior and the surface of the composite wire 8 running into it. In the take-off direction of the composite wire 8, behind the annular electrode 2, a magnetic spool 3 wound around a core 4 is arranged coaxially, whose lines of force cause the arc 1 to rotate around the wire 8 and exert a force opposite the pulling effect on the arc 1 that is produced by the wire 8 running through it.

By using a pulsed arc current, the pulling effect of the arc 1 can also be opposed and the rotational movements of the arc are evened out.

The arc 1 is fed by two direct current sources 13, 14 that can be regulated independently from one another, whose negative outputs are connected via leads to rubbing contacts 13a, 14a, one 14a of which is arranged in front of and the other 13a in back of the annular electrode 2 connected as the anode, and they are connected by electrical conductivity to the composite wire 8. The annular electrode 2 is connected to the positive outputs of the two current sources. Dividing the arc current into two divided currents coming from the respective current sources 13, 14 allows effective control of the forces acting on the base of the arc. This requires an energy yield in the workpiece (wire 8) of 500 to 1000 J/cm$^2$ for annealing the high-grade steel sheath with composite wires 8 and less than 100 J/cm$^2$ for surface cleaning. An arc from 2 to 5 cm long is produced. The current feeding the arc 1 on the cathode side on the contacts 14a, 13a in front of and behind the annular electrode 2 is divided in the ratio of 1:1.5 to 1:6. The annular electrode 2 is in the nonhomogeneous magnetic field range at a predetermined distance in front of the hollow-cylindrical magnetic coil 3; its axis is identical to the axis of the wire, and it is connected to an additional source of direct current 12. The magnetic flow should be >5000 Å.

The annular electrode 2 and the magnetic coil 3 are arranged in a housing 9 made of magnetic material symmetrical to the axis of the wire, which guarantees a magnetic ground.

Feed rollers 5,6 are arranged in the flow direction 15 in front and in back of the housing 9, which center the wire 8 to the annular electrode 2. The feed rollers 6 arranged behind the annular electrode 2 are connected to a water cooling [system]. The housing 9 and the feed rollers 6 on the pull-off side are arranged within the box 7 filled with inert gas, which contains holes for the wire 8 to go through. The inert gas is fed in the flow direction 15 behind the annular electrode 2 through nozzles 11, which are aimed at the wire 8 from several sides.

The influence of the arc 1 has its strongest effect due to the division of the electrical arc current on the cathode side. The divided current fed via the contact 13a against the flow direction 15 of the wire 8 causes a force in the same direction on the base of the arc 1. The second divided current flowing in the wire 8 in the flow direction 15 independently of the first is necessary in order to be able to control this force effect without moving the arc base point at a constant total arc current (sum of the divided currents). It is also positive here that the thermal stress on the core material is reduced by current splitting in comparison to unilateral current feed.

The outer magnetic field, whose field lines 10 run parallel to the axis in the area of the annular electrode 2 causes the arc 1 between the annular electrode 2 and the wire 8 to rotate around the wire 8. This rotation produces a component of the arc 1 that is orthogonal to the plane spanned by the magnetic field lines 10 and the ideal arc 11 (rotation components). The outer magnetic field is produced by the coreless magnetic coil 3, whose magnetic field lines 10 run parallel to the axis inside the coil near the axis. If the annular electrode 2 on the magnetic coil axis is moved out of the magnetic coil 3, as the distance from it grows, magnetic field parts can be found that are orthogonal to the axis of the wire (divergence components). The rotation component of the arc 1, in connection with the divergence components of the magnetic field, yields an interaction of forces on the arc 1, which— regardless of the direction of the magnetic field— points away from the magnetic coil 3. In order to allow this force to work against the pulling effect of the wire 8, the magnetic coil 3 is arranged in the direction in which the rod runs 15 behind the annular electrode 2.

The current of inert gas is directed opposite the flow direction 15 for this purpose. This causes, for one thing, a force on the arc 1, which reduces the pulling effect and, for another, makes the newly fed, cold inert gas flow around the heat-treated hot wire 8 and helps cool it. Moreover, surface pollution of the wire 8 loosened by the arc 1 is immediately blown out of the heat area.

The superposition of the arc current with pulses leads to the formation of a stiff arc 1 and makes it easy to move the base point of the arc 1 on the cathode side on the surface of the rod, which also reduces the pulling effect. Since the arc rotation frequency is around 500 Hz, a current pulse frequency of around 5 kHz with a pulse height of 15% of the arc current is sought.

The high-grade steel composite wire produced with this technology is distinguished by excellent corrosion resistance and has a concentric, homogeneous high-grade steel coating over the cross section and the entire wire length with good surface quality. The high-grade steel coating can amount to 15–30% by volume, depending on the thickness of the high-grade steel strip.

For example, anchors and needles for attaching concrete elements and insulating material coatings in multi-layer concrete structures can be produced. Further, the composite wires can be used as reinforcing wires and mats in thin-walled, flat and/or filigree concrete elements, for example for roof construction, which are exposed to corrosive influences over long periods of time. Other applications are safety cables in transportation, ship construction and industrial plants, fastening wires in the garden and vineyard etc., as well as elastic and tension elements in engineering with high requirements for material strength and a simultaneous need for low mass, like especially bridge-building.

One operating advantage of the process in the invention lies in the fact that conventional high-grade steel-wire drawing plants can easily be converted to process the composite wire to the final dimensions. Only one or more arc-annealing devices need be positioned at predetermined places on the drawing line. In drawing experiments, the sheathed material with a diameter of 7.6 mm was drawn to a diameter of 2.5 mm. At a diameter of 5.6 mm, an intermediate annealing was carried out in the flow by means of magnetically moved arcs.

High-grade steel-plated wire can be produced according to this method with final strengths $\leq 2000$ N/mm$^2$. Decisive for the size of the strength are the core wire quality chosen and the degree of forming in the drawing process.

The cost advantage compared to solid high-grade steel wire is 30–50%.

We claim:

1. A process for producing a corrosion-resistant composite wire, comprising:
    providing a surface-treated core wire;
    forming a composite wire by sheathing the core wire in a longitudinally curved trimmed metal strip and welding the metal strip longitudinally to provide a metal sheath on the core wire;
    drawing the composite wire to form fit the metal sheath to the core wire and to reduce the cross section of the composite wire by at least approximately 65%; and
    annealing the composite wire by raising the temperature of the metal sheath to an annealing temperature and raising the temperature of the core wire to a temperature less than an annealing temperature.

2. The process of claim 1, further comprising the step of further drawing the composite wire to a final dimension to improve an adhesion strength between the core wire and the metal sheath.

3. The process of claim 1, wherein the annealing step comprises forming an arc rotating magnetically around the composite wire.

4. The process of claim 1, further comprising the step of removing drawing media residue from the core wire.

5. The process of claim 4, wherein the drawing media residue is removed by ultrasound cleaning.

6. The process of claim 5 further comprising the step of eliminating surface coatings of the core wire with wire brushes.

7. The process of claim 1, further comprising the step of removing adhesively bound surface coatings on the core wire by a rotating arc.

8. The process of claim 1, wherein the metal sheath is provided by a strip of high-grade steel.

9. The process of claim 1, wherein the core wire comprises a steel wire.

10. The process of claim 1, wherein the core wire comprises a copper wire.

* * * * *

UNITED STATES PATENT AND TRADEMARK OFFICE
CERTIFICATE OF CORRECTION

PATENT NO. : 5,366,569
DATED : Nov. 22, 1994
INVENTOR(S) : Volker Müller, et al.

It is certified that error appears in the above-indentified patent and that said Letters Patent is hereby corrected as shown below:

Column 4, line 30, "(40)" should read --40--.

Column 5, line 54, ">5000 Å." should read -->5000 A.--.

Signed and Sealed this

Seventeenth Day of September, 1996

Attest:

BRUCE LEHMAN

Attesting Officer  Commissioner of Patents and Trademarks